United States Patent

Hara et al.

[11] Patent Number: 4,950,920
[45] Date of Patent: Aug. 21, 1990

[54] COMPLEMENTARY SIGNAL OUTPUT CIRCUIT WITH REDUCED SKEW

[75] Inventors: Hiroyuki Hara, Tokyo; Masaji Ueno, Kanagawa, both of Japan

[73] Assignee: Kabushiki Kaisha Toshiba, Kanagawa, Japan

[21] Appl. No.: 230,549

[22] Filed: Aug. 10, 1988

[30] Foreign Application Priority Data

Sep. 30, 1987 [JP] Japan ................. 62-246767

[51] Int. Cl.$^5$ .................. H03K 5/00; H03K 19/02; H03K 5/13
[52] U.S. Cl. .................. 307/262; 307/443; 307/446; 307/269; 307/570
[58] Field of Search ............ 307/262, 263, 443, 446, 307/451, 269, 480, 574, 570, 544, 549, 581

[56] References Cited

U.S. PATENT DOCUMENTS

| | | | |
|---|---|---|---|
| 4,103,188 | 7/1978 | Morton | 307/446 |
| 4,558,234 | 12/1985 | Suzuki et al. | 307/443 |
| 4,574,203 | 3/1986 | Baba | 307/269 |
| 4,625,127 | 11/1986 | Lee | 307/270 |
| 4,746,823 | 5/1988 | Lee | 307/601 |

FOREIGN PATENT DOCUMENTS 0034577 3/1980 Japan ................. 307/270

*Primary Examiner*—Timothy P. Callahan
*Attorney, Agent, or Firm*—Finnegan, Henderson, Farabow, Garrett and Dunner

[57] ABSTRACT

A complementary signal output circuit for supplying an in-phase and an anti-phase output signal in response to an input signal. The falling of the in-phase signal from a high to a low level and the rising of the anti-phase signal from a low to a high level are both controlled in a manner which serves to speed up the output of the anti-phase signal and reduce skew between the complementary signals. This is accomplished by providing a number of inverter means, and transistor means which outputs a low-to-high signal to the anti-phase output in response to the inverted input signal. Additional circuitry responsive to the input signal is used to prevent undesired current from flowing through the transistor and inverter means.

7 Claims, 4 Drawing Sheets

COMPLEMENTARY SIGNAL OUTPUT CIRCUIT WITH REDUCED SKEW

BACKGROUND OF THE INVENTION

1. Field of the Invention

This invention concerns a complementary signal output circuit which supplies complementary signals which are in-phase with and anti-phase to an input signal.

2. Description of the Prior Art

FIG. 1 is a block diagram of a conventional complementary signal output circuit for obtaining mutually anti-phase complementary signals which are used as, e.g., clock signals for logic circuits.

The complementary signal output circuit of FIG. 1 is constructed from inverter circuits I1–I4 composed of, for instance, CMOS circuits. An input signal IN is received by the inverter circuit I1, and inverted thereby. The output signal of the inverter circuit I1 is inverted by the inverter circuit I2. Then, the output signal of the inverter circuit I2 is inverted by the inverter circuit I3, and the output of the inverter circuit I3 is obtained as an anti-phase signal $\bar{\phi}$ which is anti-phase to the input signal IN. At the same time, the output signal of the inverter circuit I1 is inverted by the inverter circuit I4, and the output signal of the inverter circuit I4 is obtained as an in-phase signal $\phi$ which is in-phase with the input signal.

Therefore, in this circuit, whereas the anti-phase signal $\bar{\phi}$ is obtained by an odd number of inverter circuits I1, I2 and I3 which are cascade-connected to the input signal IN, the in-phase signal $\phi$ is obtained by an even number of inverter circuits I1 and I4 which are cascade-connected to the input signal IN. That is to say, while the in-phase signal $\bar{\phi}$ is outputted with a delay time of 2 stages of inverter circuits with respect to the input signal IN, the anti-phase signal $\phi$ is outputted with a delay time of 3 stages of inverter circuits with respect to the input signal IN. Thus, as shown by the operating waveform diagram in FIG. 2, the anti-phase signal $\bar{\phi}$ is delayed by one more stage of inverter circuit when compared with the in-phase signal $\phi$.

Thus, there is a problem of different switching times between the in-phase signal $\phi$ and the anti-phase signal $\bar{\phi}$ in the prior art, which sometimes causes a misoperation of the circuit being supplied with the signals.

SUMMARY OF THE INVENTION

Therefore, an object of this invention is to provide a complementary signal output circuit which can make the switching times of the in-phase signal and the anti-phase signal approximately equal, using a simple construction.

In order to achieve the above object, this invention provides a complementary signal output circuit for supplying a first output signal and a second output signal in response to an input signal alternating between a high level state and a low level state in a predetermined phase, and a power source voltage, comprising the following elements. A first inverter is provided for outputting a first signal in response to the input signal. A second inverter is provided for receiving the first signal and for outputting the first output signal having substantially the predetermined phase of the input signal. A third inverter is provided for receiving the first output signal and outputting the second output signal having a substantially opposite phase to the predetermined phase of the input signal. A transistor, responsive to the first signal and the power source voltage, is provided for changing the second output signal from a low level state to a high level state substantially simultaneously with a change of the first output signal from a high level state to a low level state by outputting the power source voltage to an output of the third inverter. A circuit, connected to the third inverter and responsive to the input signal, is provided for preventing a current from flowing through the transistor and the third inverter.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

The present preferred embodiments of this invention are explained below using drawings.

Figure 3:
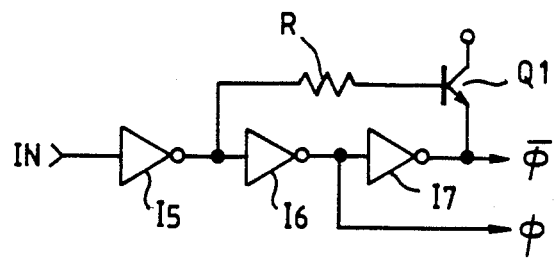
FIG. 3 is a block diagram of a complementary signal output circuit of an embodiment of this invention.

FIG. 3 is a block diagram of a complementary signal output circuit of an embodiment of this invention. The complementary signal output circuit shown in FIG. 3 comprises inverter circuits I5, I6 and I7, which are cascade-connected, and an NPN type bipolar transistor Q1. This circuit is a construction for the case when the load (not shown) to be supplied with the complementary signals $\phi$ and $\bar{\phi}$ is relatively light.

The inverter circuit I5 receives an input signal IN to be inverted, and applies its output signal to the inverter circuit I6. The inverter circuit I6 receives the output signal of the inverter circuit I5 to be inverted, and supplies an in-phase signal $\phi$ which is in-phase with the input signal. The inverter circuit I7 receives the in-phase signal $\phi$ which is the output signal of the inverter circuit I6 to be inverted, and supplies an anti-phase signal $\bar{\phi}$ which is anti-phase to the input signal IN.

The base electrode of the bipolar transistor Q1 is connected to the output terminal of the inverter circuit I5 via a current-limiting resistor R. The collector electrode of the transistor Q1 is connected to the power source, e.g. 5V, and the emitter electrode thereof is connected to the output terminal of the inverter circuit I7.

Figure 1:
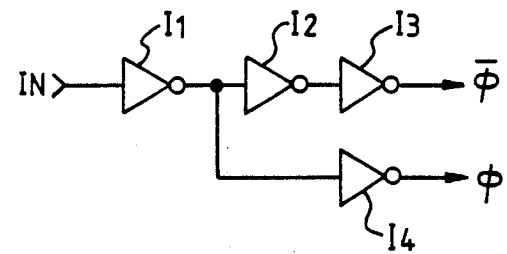
FIG. 1 is a block diagram of a conventional complementary signal output circuit.
Figure 2:
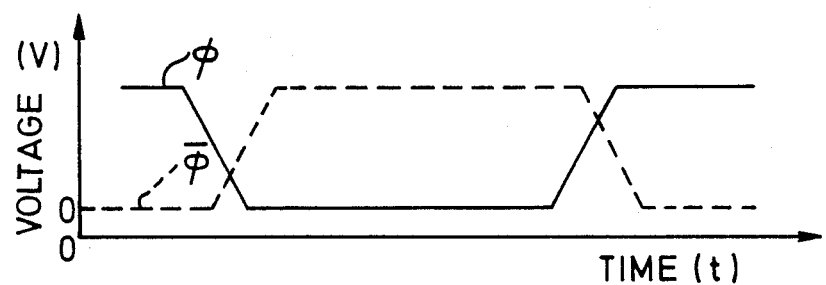
FIG. 2 is a wave-form diagram of the complementary signal output circuit shown in FIG. 1.

In this circuit, when the input signal IN falls from a high level to a low level, the output signal of the inverter circuit I5 rises from a low level to a high level. When the output signal to the inverter circuit I5 shifts from a low level to a high level, the output signal of the inverter circuit I6 falls from a high level to a low level, and the in-phase signal φ is obtained. At the same time, when the output signal of the inverter circuit I5 rises from a low level to a high level, the bipolar transistor Q1 changes from the non-conductive state to the conductive state. Therefore, the anti-phase signal $\overline{\phi}$ starts to rise from a low level to a high level. When the output signal of the inverter circuit I6, namely the in-phase signal φ, falls from a high level to a low level, the in-phase signal φ is inverted by the inverter circuit I7, and the rising of the anti-phase signal $\overline{\phi}$ from a low level to a high level is also carried out by the inverter circuit I7. In other words, the falling of the in-phase signal φ and the rising of the anti-phase signal $\overline{\phi}$ are both controlled by the output signal of the inverter circuit I5. Consequently, the time difference (skew) between the rising edge of the anti-phase signal $\overline{\phi}$ and the falling edge of in-phase signal φ becomes smaller. Thus, it is possible to make the skew of the complementary signals φ and $\overline{\phi}$ much smaller than has been obtained by the conventional complementary signal output circuit shown in FIG. 1. Moreover, the delay time of the anti-phase signal $\overline{\phi}$ with regard to the input signal IN is approximately the delay time of 2 stages of inverter circuits. Thus, the inversion of the anti-phase signal $\overline{\phi}$ can be accomplished obtained faster than in the conventional circuit shown in FIG. 1.

Figure 4:
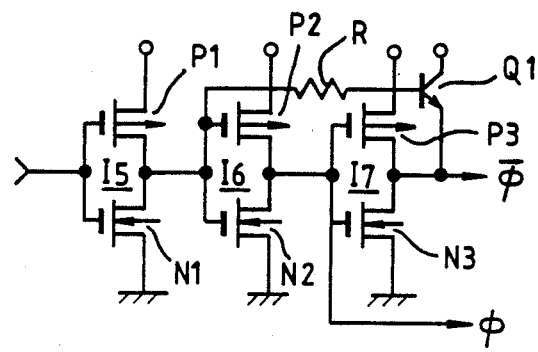
FIGS. 4 and 5 are circuit diagrams showing practical constructions for the complementary signal output circuit shown in FIG. 3.

FIG. 4 is a circuit diagram of a concrete circuit of the complementary signal output circuit shown in FIG. 3. In this circuit, CMOS circuits are used for the inverter circuits I5, I6 and I7. In FIG. 4, the inverter circuit I5 is constructed from a PMOS P1 and an NMOS N1, the inverter circuit I6 is constructed from a PMOS P2 and an NMOS N2, and the inverter circuit I7 is constructed from a PMOS P3 and an NMOS N3. By constructing the inverter circuits from CMOS circuits, the same effect which can be obtained with the circuit shown in FIG. 3 is obtained with a lower power consumption.

Figure 5:
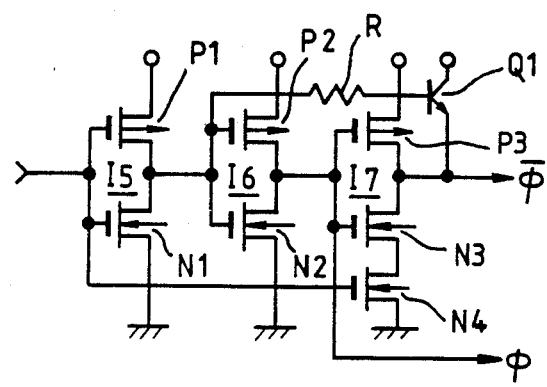

FIG. 5 is a circuit diagram of another concrete circuit of the complementary signal output circuit shown in FIG. 3. In this circuit, each inverter circuit I5, I6 and I7 is constructed from CMOS circuit, in the same way as the complementary signal output circuit shown in FIG. 4. The difference between this circuit and the circuit of FIG. 4 is an addition of an NMOS N4. The NMOS N4 is connected between the NMOS N3, which composes the inverter circuit I7, and ground. The remainder of the construction is the same as in FIG. 4, and has been given the same symbols.

In the complementary signal output circuit shown in FIG. 4, after the output signal of the inverter circuit I5 has changed from a low level to a high level, there is a period when the bipolar transistor Q1 and the NMOS N3 are both in the conductive state, during the shift of the NMOS N3 from the conductive state to the non-conductive state.

The characteristic of the complementary signal output circuit of FIG. 5 is that the circuit is designed to prevent a through current flowing from the power source to the ground via the bipolar transistor Q1 and the NMOS N3 during the above described period by causing the NMOS N4 to change from the conductive state into the non-conductive state when the input signal has shifted from the high level to the low level.

In this circuit, it is of course possible to make the skew between the rising edge of the anti-phase signal $\overline{\phi}$ and the falling edge of the in-phase signal φ smaller in respect of the fall of the input signal IN.

Figure 6:
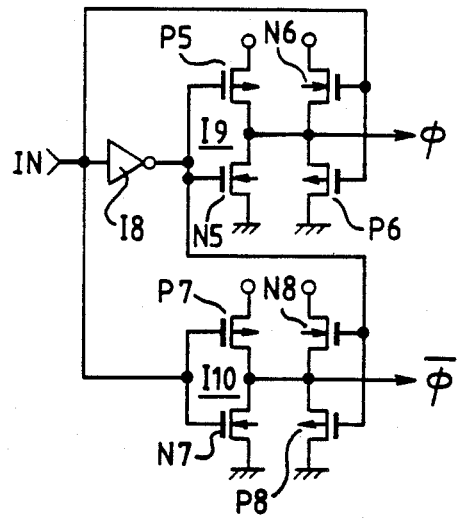
FIGS. 6, 7, 9 and 10 are circuit diagrams of other embodiments of this invention.

FIG. 6 is a circuit diagram of a further embodiment of this invention. In this circuit, a MOS circuit instead of a bipolar transistor is used to make the skew between the anti-phase signal $\overline{\phi}$ and the in-phase signal φ small. In this circuit, an inverter circuit I9 is connected to the output of an inverter circuit I8, which receives and inverts the input signal IN. The inverter circuit I9 is composed of a PMOS P5 and an NMOS N5, and outputs an in-phase signal φ from the interconnected drain electrodes of those devices. The gate electrode of the PMOS P5 is connected to the output of the inverter circuit I8, and the source electrode thereof is connected to the power source. The gate electrode of the NMOS N5 is connected to the output of the inverter circuit I8, and the source electrode thereof is connected to the ground. The source electrodes of an NMOS N6 and a PMOS P6 are connected to the output of the inverter circuit I9. The gate electrodes of the NMOS N6 and PMOS P6 are supplied with the input signal IN, and the drain electrodes thereof are connected to the power source and the ground, respectively.

An inverter circuit I10 is connected to the input of the inverter circuit I8, and outputs an in-phase signal φ. The inverter circuit I10 is composed of a PMOS P7 and an NMOS N7, which both receive the input signal at their respective gate electrodes, and whose respective drain electrodes are interconnected. The source electrodes of an NMOS N8 and a PMOS P8 are connected to the output of the inverter circuit I10. The gate electrodes of the NMOS N8 and the PMOS P8 are connected to the output of the inverter circuit I8, and the drain electrodes of the NMOS N8 and the PMOS P8 are connected to the power source and the ground, respectively.

In this circuit, when the input signal IN starts to rise from a low level to a high level, the NMOS N6 and N7 change into their conductive states. Thus, the in-phase signal φ starts to rise from a low level to a high level, and at the same time, the anti-phase signal $\overline{\phi}$ starts to fall from a high level to a low level. Then, when the output signal of the inverter circuit I8 shifts from a high level to a low level, the PMOS P5 and P8 both change into the conductive state.

When the input signal IN starts to fall from a high level to a low level, the PMOS P6 and P7 change into the conductive state. Thus, the in-phase signal φ starts to fall from a high level to a low level and, at the same time, the anti-phase signal $\overline{\phi}$ starts to rise from a low level to a high level. Then, when the output signal of the inverter circuit I8 shifts from a low level to a high level, the NMOS N5 and N8 both change into the conductive state. As explained above, the start of the rising and the falling of the complementary signals φ and $\overline{\phi}$ is controlled by changing the NMOS N6, N7 and the PMOS P6, P7 with the input signal IN, and the start points of the rising and the falling of the complementary signals φ and $\overline{\phi}$ are approximately the same. Thus, it is possible to make the switching times of the respective complementary signals φ and $\overline{\phi}$ almost equal. Moreover, the in-phase signal φ is raised to the power source potential by the PMOS P5. Furthermore, as the inverter circuit I9 and I10 are added to the MOS circuits N6, P6 and N8, P8 of the same construction, a balance of the output signal φ and $\overline{\phi}$ is maintained.

Figure 7:
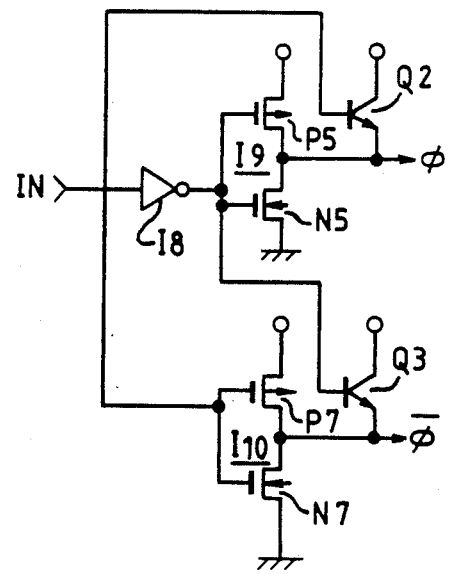

FIG. 7 is a circuit diagram of further embodiment of this invention. The complementary signal output circuit shown in FIG. 7 is constructed from inverter circuits I8, I9 and I10 and NPN type bipolar transistors (hereafter "BT") Q2 and Q3. In this circuit, the input signal IN is applied to the base electrode of the BT Q2. The collector electrode of the BT Q2 is connected to the power source, and the emitter electrode thereof is connected to the output of the inverter circuit I9. The conductivity of the BT Q2 is controlled by the input signal IN.

The base electrode of the BT Q3 is connected to the output terminal of the inverter circuit I8. The collector electrode of the BT Q3 is connected to the power source, and the emitter electrode thereof is connected to the output terminal of the inverter circuit I10. The conductivity of the BT Q3 is controlled by the output signal of the inverter circuit I8.

In this circuit, when the input signal starts to rise from a low level to a high level, the BT Q2 and NMOS N7 change into the conductive state, and the in-phase signal $\phi$ starts to rise and the anti-phase signal $\bar{\phi}$ starts to fall. Then, when the output signal of the inverter circuit I8 falls from a high level to a low level, the PMOS P5 changes into the conductive state and carries out the raising of the in-phase signal $\phi$. In this way, as the rise of the in-phase signal $\phi$ starts when the BT Q2 changes into the conducting state by being supplied with the input signal IN, the delay due to the existence of the inverter circuit I8 is compensated.

Next, when the input signal IN starts to fall from a high level to a low level, the PMOS P7 changes into the conductive state and the anti-phase signal $\bar{\phi}$ starts to rise. Then, when the output signal of the inverter circuit I8 rises from a low level to a high level, the NMOS N5 changes into the conductive state and the in-phase signal $\phi$ starts to fall. Moreover, at the same time, the BT Q3 changes into the conductive state and carries out the raising of the anti-phase signal $\bar{\phi}$.

Figure 8:
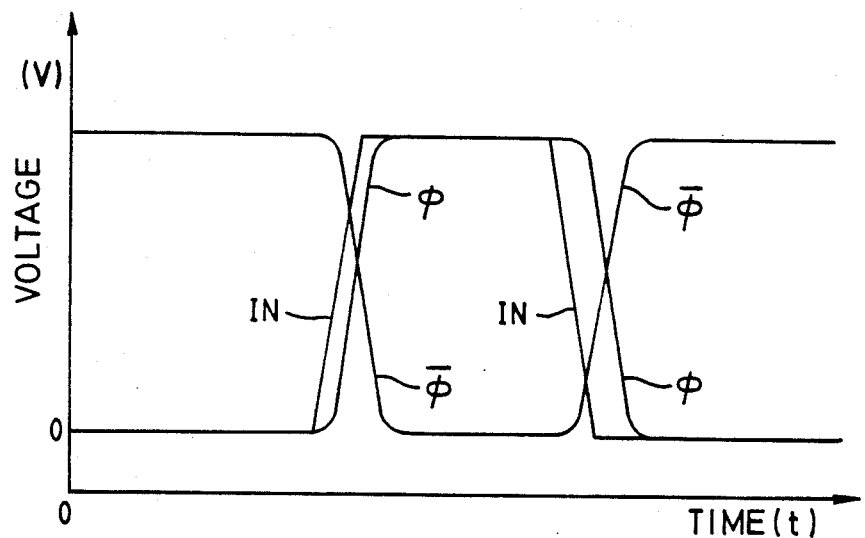
FIG. 8 is a wave-form diagram of the complementary signal output circuit shown in FIG. 7.

FIG. 8 is a diagram showing the simulated result of the complementary signals $\phi$ and $\bar{\phi}$, in respect of the input signal IN in the circuit shown in FIG. 7. As shown in FIG. 8, in the circuit construction shown in FIG. 7, it is possible to make the potentials of the intersections of the respective rises and falls of the complementary signals $\phi$ and $\bar{\phi}$ almost agree, and the switching times can be made almost equal. Furthermore, the bipolar transistors Q2 and Q3, which carry out the raising of the complementary signals $\phi$ and $\bar{\phi}$, are provided at the output terminals of the inverter circuit I9 and I10. Thus, using the high current drivability of these bipolar transistors, it is possible to make the rising waveforms of the complementary signals $\phi$ and $\bar{\phi}$ sharper, even for heavy loads.

Figure 9:
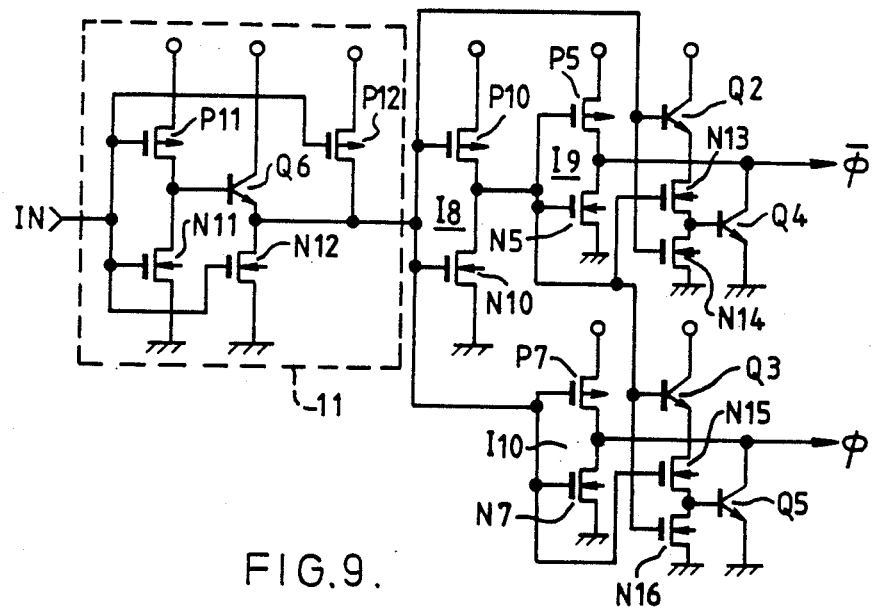

FIG. 9 is a circuit diagram of yet another embodiment of this invention. The complementary signal output circuit shown in FIG. 9 has the characteristics that, at the output terminals of inverter circuits I9 and I10 of the complementary signal output circuit shown in FIG. 7, NPN type BT Q4 and BT Q5 are provided to speed up the falling speed of the complementary signals $\bar{\phi}$ and $\phi$. Moreover, this complementary signal output circuit is designed so that, by applying an input signal IN to the input of the inverter circuit I8 via an input circuit 11, the anti-phase signal $\phi$ is obtained from the output of inverter circuit I9, and the in-phase signal $\phi$ is obtained from the output terminal of the inverter circuit I10.

The inverter circuit I8 is composed of a PMOS P10 and an NMOS N10, and the input circuit 11 is composed of PMOS P11 and P12, NMOS N11 and N12 and BT Q6.

When the input signal shifts from a high level to a low level, the PMOS P11 and P12 and BT Q6 in the input circuit 11 all change into the conductive state and a high level signal is applied to the inverter circuit 18. When the input signal shifts from a low level to a high level, the NMOS N11 and N12 change into the conductive state and a low level signal is applied to the inverter circuit I8. That is to say, the input circuit 11 applies a signal which is an inversion of the input signal IN to the inverter circuit I8.

The BT Q4 is connected between the output terminal of the inverter circuit I9 and ground, and its base electrode is connected to the node between the NMOS N13 and N14, which are connected in series between the output terminal of the inverter circuit I9 and the ground. The conductivity of the NMOS N13 is controlled by the output signal of the inverter circuit I8, and the conductivity of the NMOS N14 is controlled by the output signal of input circuit 11.

The BT Q5 is connected between the output terminal of the inverter circuit I10 and the ground, and its base electrode is connected to the node between the NMOS N15 and N16, which are connected in series between the inverter circuit I10 and the ground. The conductivity of the NMOS N15 is controlled by the output signal of the input circuit 11, and the conductivity of the NMOS N16 is controlled by the output signal of the inverter circuit I8.

In this circuit, the basic operation is the same as that of the circuit shown in FIG. 7. During the falling time of the complementary signals $\phi$ and $\bar{\phi}$, the falling speed of the complementary signals $\phi$ and $\bar{\phi}$ speeded-up by the operation of the BT Q4 and BT Q5.

That is to say, when the input signal to the inverter circuit I9 rises from a low level to a high level, the NMOS N5 changes into the conductive state and the anti-phase signal $\bar{\phi}$ starts to fall. At the same time, the NMOS N13 changes into the conductive state and the NMOS N14 changes into the non-conductive state. Thus, a current flows from the load (not shown) via the NMOS N13 to the base electrode of the BT Q4 to make the Q4 conductive state. Therefore, the current driving drivability is increased due to the BT Q4 compared with the case where the NMOS N5 alone. Thus, the falling of the anti-phase signal $\bar{\phi}$ is speeded-up.

When the input signal IN falls from a high level to a low level, the NMOS N7 changes into the conductive state, and the in-phase signal $\phi$ starts to fall. At the same time, the NMOS N15 changes into the conductive state, and the NMOS N16 changes into the non-conductive state. In this way, in the same way as described above, the BT Q5 changes into the conductive state and the falling speed of the in-phase signal $\phi$ is speeded-up.

Consequently, the rising and falling wave-forms of the complementary signals $\phi$ and $\bar{\phi}$ can be made sharper, even for heavy loads.

Figure 10:
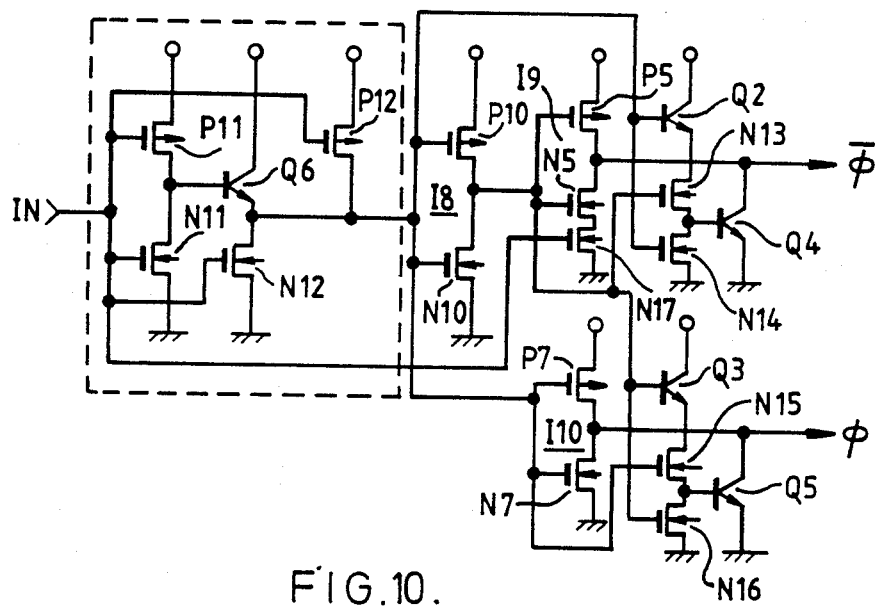

FIG. 10 is a circuit diagram of still another embodiment of this invention. The characteristic of this embodiment is that, in order to prevent a through current attempting to flow from the power source to the ground via the BT Q2 and the NMOS N5 in the complementary signal output circuit shown in FIG. 9, an NMOS N17 is inserted between the NMOS N5 and the ground. The conductivity of the NMOS N17 is controlled by the input signal IN.

When the input signal IN falls from a high level to a low level, whereas the BT Q2 changes into the conductive state in respective to the high level output signal of the input circuit 11, the NMOS N5 changes into the non-conductive state after a delay time due to the 1- stage component of the inverter circuit I8. Because of this, the BT Q2 and NMOS N5 become temporarily in the conductive state at the same time. Therefore, by changing the conductivity of the NMOS N17 into the non-conductive state before the BT Q2 changes into the conductive state, by applying the input signal IN to the NMOS N17, a through current is prevented.

When using this invention as described above, either or both of the switching operations of the complementary signals may be compensated by either or both of a transistor connected between the output of an even-numbered inverter circuit and the power source and a transistor connected between the output of an odd-numbered inverter circuit and the power source. Thus, it becomes possible, using a simple construction, to make the switching times of each complementary signal in respect of the input signal almost equal.

Incidentally, in the above embodiments, the inverter circuits are not limited to the CMOS construction composed of a PMOS and an NMOS, and they may, for instance, be composed of an NMOS and resistors or of an NMOS alone.

The present invention has been described with respect to specific embodiments. However, other embodiments based on the principles of the present invention should be obvious to those of ordinary skill in the art. Such embodiments are intended to be covered by the claims.

What is claimed is:

1. A complementary signal output circuit for supplying a first output signal and a second output signal in response to an input signal alternating between a high level state and a low level state in a predetermined phase and a power source voltage comprising:
   first inverter means for outputting a first signal in response to the input signal;
   second inverter means for receiving said first signal and for outputting said first output signal having substantially said predetermined phase of said input signal;
   third inverter means for receiving said first output signal and outputting said second output signal having a substantially opposite phase to the predetermined phase of said input signal;
   transistor means, responsive to said first signal and said power source voltage, for changing said second output signal from a low level state to a high level state substantially simultaneously with a change of said first output signal from a high level state to a low level state by outputting said power source voltage to an output of said third inverter means; and
   circuit means, connected to said third inverter means and responsive to said input signal, for preventing a current from flowing through said transistor means and said third inverter means.

2. The complementary signal output circuit of claim 1, wherein said transistor means comprises a bipolar transistor having a base electrode supplied with said first signal, an emitter electrode connected to said output of said third inverter means and a collector electrode supplied with said power source voltage.

3. The complementary signal output circuit of claim 1, wherein said first, said second, and said third inverter means each comprises a CMOS inverter circuit.

4. The complementary signal output circuit of claim 3, wherein said circuit means comprises a MOS transistor connected to said CMOS inverter circuit of said third inverter means and supplied with said input signal, said MOS transistor being changed into a non-conductive state when said input signal shifts from a high level state to a low level state.

5. A complementary signal output circuit for supplying an in-phase output signal and an anti-phase output signal in response to an input signal having a prescribed rising edge, a power source voltage and a reference voltage, comprising:
   first circuit means for outputting the in-phase output signal in response to the input signal, including a first inverter circuit for outputting a first signal in response to the input signal and a second inverter circuit receiving the first signal;
   second circuit means for outputting the anti-phase output signal in response to the input signal, including a third inverter circuit;
   first transistor means for controlling the rising of the in-phase output signal in response to the rising edge of the input signal and the power source voltage; and
   second transistor means for controlling the rising of the anti-phase output signal in response to the first signal and the power source voltage.

6. The complementary signal output circuit of claim 5, wherein each of the first, the second and the third inverter circuits includes a first terminal supplied with the power source voltage, a second terminal supplied with the reference voltage and a CMOS inverter circuit connected between the first and the second terminals.

7. The complementary signal output circuit of claim 5, further comprising third transistor means for controlling the falling of the in-phase output signal in response to the input signal, and fourth transistor means for controlling the falling of the anti-phase signal in response to the first signal.

* * * * *